United States Patent
Ku et al.

(10) Patent No.: US 11,538,266 B2
(45) Date of Patent: Dec. 27, 2022

(54) DISPLAY DEVICE

(71) Applicant: Samsung Display Co., Ltd., Yongin-si (KR)

(72) Inventors: Kyowon Ku, Seoul (KR); Junghak Kim, Hwaseong-si (KR); Youngsik Kim, Yongin-si (KR); Eunhye Kim, Hwaseong-si (KR); Jaehyung Jo, Anyang-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 54 days.

(21) Appl. No.: 17/023,287

(22) Filed: Sep. 16, 2020

(65) Prior Publication Data

US 2021/0081635 A1    Mar. 18, 2021

(30) Foreign Application Priority Data

Sep. 17, 2019    (KR) .......................... 10-2019-0114192

(51) Int. Cl.
| | |
|---|---|
| *G06F 1/20* | (2006.01) |
| *G06V 40/13* | (2022.01) |
| *B06B 1/06* | (2006.01) |
| *H01L 27/32* | (2006.01) |

(52) U.S. Cl.
CPC ........ *G06V 40/1306* (2022.01); *B06B 1/0688* (2013.01); *G06F 1/203* (2013.01); *H01L 27/3234* (2013.01)

(58) Field of Classification Search
CPC .............. G06V 40/1306; B06B 1/0688; H01L 27/3234; G06F 1/203; G06F 21/32
See application file for complete search history.

(56) References Cited

U.S. PATENT DOCUMENTS

| | | | |
|---|---|---|---|
| 2018/0341290 | A1 | 11/2018 | Sim et al. |
| 2019/0073505 | A1 | 3/2019 | Kwon et al. |
| 2019/0087630 | A1 | 3/2019 | Seo et al. |
| 2020/0057902 | A1 | 2/2020 | Kim et al. |
| 2020/0133407 | A1* | 4/2020 | Kim ................. G06F 21/32 |
| 2020/0134278 | A1* | 4/2020 | Lee .................. G06F 1/203 |

FOREIGN PATENT DOCUMENTS

| | | |
|---|---|---|
| KR | 10-2018-0114797 | 10/2018 |
| KR | 10-2018-0130151 | 12/2018 |
| KR | 10-2019-0026476 | 3/2019 |
| KR | 10-2019-0030907 | 3/2019 |

* cited by examiner

*Primary Examiner* — Abdul-Samad A Adediran
(74) *Attorney, Agent, or Firm* — H.C. Park & Associates, PLC

(57) ABSTRACT

A display device includes a display panel, a fingerprint sensing part, and a cover panel. The fingerprint sensing part is covered by the display panel. The cover panel is covered by the display panel and includes a metal layer. The metal layer includes a first metal layer and a second metal layer. The first metal layer surrounds the fingerprint sensing part in a plan view. The second metal layer extends from the first metal layer and is disposed between the display panel and the fingerprint sensing part.

20 Claims, 12 Drawing Sheets

DISPLAY DEVICE

CROSS-REFERENCE TO RELATED APPLICATION

This application claims priority to and the benefit of Korean Patent Application No. 10-2019-0114192, filed Sep. 17, 2019, which is hereby incorporated by reference for all purposes as if fully set forth herein.

BACKGROUND

Field

Exemplary embodiments generally relate to a display device, and more particularly, to a display device including a fingerprint sensing part.

Discussion

Display devices provide various functions for organically communicating with a user, such as displaying an image to provide information to the user or sensing a user's input. Some display devices also include a function of sensing a user's fingerprint. The fingerprint sensing method may include a capacitance method for sensing a change in capacitance generated between electrodes, an optical method for sensing incident light using an optical sensor, and an ultrasonic method for sensing vibration using a piezoelectric body. A fingerprint sensor for sensing the fingerprint may be disposed and assembled on a rear surface of a display panel.

The above information disclosed in this section is only for understanding the background of the inventive concepts, and, therefore, may contain information that does not form prior art.

SUMMARY

Some aspects are capable of providing a display device having improved driving performance of a fingerprint sensing part.

Some aspects are capable of providing a display device in which a fingerprint sensing part is not seen to the outside.

Additional aspects will be set forth in the detailed description which follows, and, in part, will be apparent from the disclosure, or may be learned by practice of the inventive concepts.

According to some aspects, a display device includes a display panel, a fingerprint sensing part, and a cover panel. The fingerprint sensing part is covered by the display panel. The cover panel is covered by the display panel and includes a metal layer. The metal layer includes a first metal layer and a second metal layer. The first metal layer surrounds the fingerprint sensing part in a plan view. The second metal layer extends from the first metal layer and is disposed between the display panel and the fingerprint sensing part.

According to some aspects, a display device includes a display panel, a cover panel, and a fingerprint sensing part. The cover panel is covered by the display panel and includes a metal layer. The fingerprint sensing part is covered by the metal layer. The fingerprint sensing part includes a fingerprint sensor and a sensing circuit board connected to the fingerprint sensor. The cover panel further includes a functional layer covered by the metal layer. The fingerprint sensor is disposed in a first opening in the functional layer. The sensing circuit board is disposed in a second opening in the functional layer.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concepts, and are incorporated in and constitute a part of this specification, illustrate exemplary embodiments of the inventive concepts, and, together with the description, serve to explain principles of the inventive concepts. In the drawings.

DETAILED DESCRIPTION OF SOME EXEMPLARY EMBODIMENTS

Figure 1:
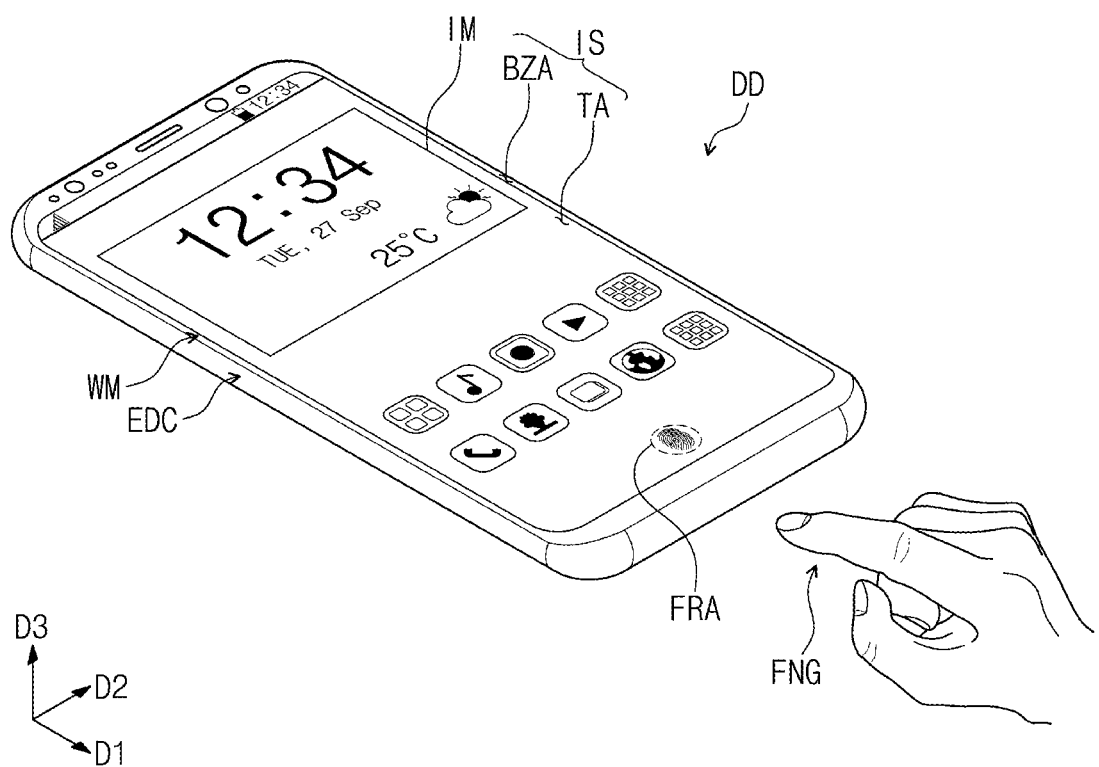
FIG. 1 is a perspective view of a display device according to some exemplary embodiments.

In the following description, for the purposes of explanation, numerous specific details are set forth in order to provide a thorough understanding of various exemplary embodiments. As used herein, the terms "embodiments" and "implementations" are used interchangeably and are non-limiting examples employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some exemplary embodiments. Therefore, unless otherwise specified, the features, components, modules, layers, films, panels, regions, aspects, etc. (hereinafter individually or collectively referred to as an "element" or "elements"), of the various illustrations may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. As such, the sizes and relative sizes of the respective elements are not necessarily limited to the sizes and relative sizes shown in the drawings. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element, it may be directly on, connected to, or coupled to the other element or intervening elements may be present. When, however, an element is referred to as being "directly on," "directly connected to," or "directly coupled to" another element, there are no intervening elements present. Other terms and/or phrases used to describe a relationship between elements should be interpreted in a like fashion, e.g., "between" versus "directly between," "adjacent" versus "directly adjacent," "on" versus "directly on," etc. Further, the term "connected" may refer to physical, electrical, and/or fluid connection. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one element's relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional views, isometric views, perspective views, plan views, and/or exploded illustrations that are schematic illustrations of idealized exemplary embodiments and/or intermediate structures. As such, variations from the shapes of the illustrations as a result of, for example, manufacturing techniques and/or tolerances, are to be expected. Thus, exemplary embodiments disclosed herein should not be construed as limited to the particular illustrated shapes of regions, but are to include deviations in shapes that result from, for instance, manufacturing. To this end, regions illustrated in the drawings may be schematic in nature and shapes of these regions may not reflect the actual shapes of regions of a device, and, as such, are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

As customary in the field, some exemplary embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some exemplary embodiments may be physically separated into two or more interacting and discrete blocks, units, and/or modules without departing from the inventive concepts. Further, the blocks, units, and/or modules of some exemplary embodiments may be physically combined into more complex blocks, units, and/or modules without departing from the inventive concepts.

Hereinafter, various exemplary embodiments will be explained in detail with reference to the accompanying drawings.

Figure 2:
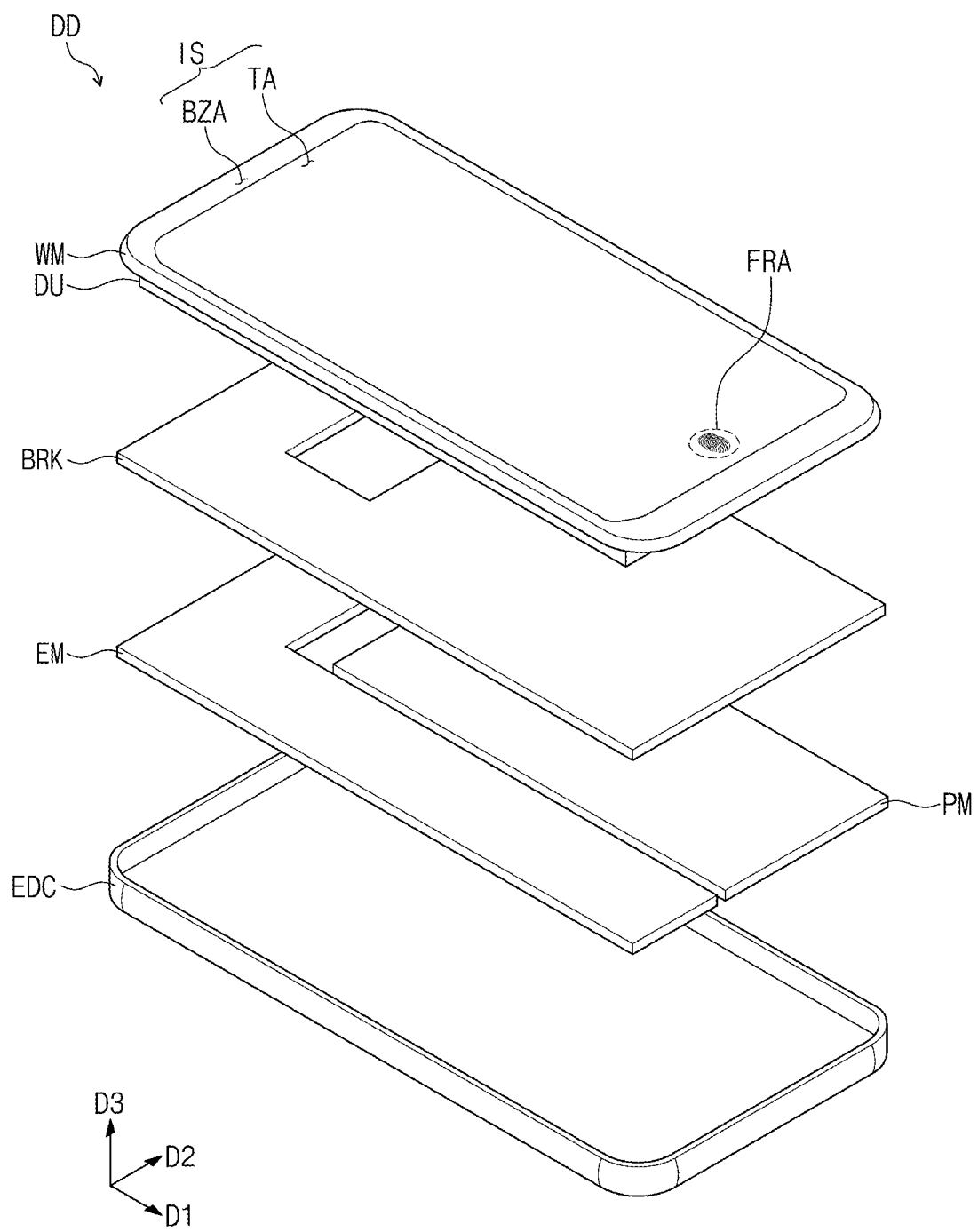
FIG. 2 is an exploded perspective view illustrating the display device according to some exemplary embodiments.

FIG. 1 is a perspective view of a display device according to some exemplary embodiments. FIG. 2 is an exploded perspective view of the display device of FIG. 1 according to some exemplary embodiments.

Referring to FIG. 1, a display device DD may be a device activated according to an electrical signal. The display device DD may include or implemented in association with various embodiments. For example, the display device DD may include a tablet, a notebook, a computer, a smart television, and/or the like. For convenience, the display device DD will, hereinafter, be described and illustratively shown as a smart phone.

The display device DD may include a display surface IS parallel to each of a first direction D1 and a second direction D2, and is configured to display an image IM in a third direction D3. The second direction D2 may mean a direction crossing the first direction D1. The third direction D3 is defined as a direction that is substantially perpendicular to a plane defined by the first and second directions D1 and D2. Also, in this specification, the phrases "viewed from a (or the) plane" or "in a (or the) plan view" may mean a state viewed from (or in) the third direction D3. The directions indicated as the first to third direction D1, D2, and D3 may be a relative concept, and thus, changed into different directions. Hereinafter, the first to third directions may be directions indicated by the first to third directions D1, D2, and D3 and designated by the same reference numerals, respectively.

In a plan view, the display device DD may have a rectangular (or generally rectangular) shape. Each of corner portions of the display device DD may have a rounded (or generally rounded) shape. However, the shape of the display device DD is not limited thereto.

The display surface IS on which the image IM is displayed may correspond to a front surface of the display device DD. The image IM may include a still image and/or a dynamic image. FIG. 1 illustrates an Internet search window as an example of the image IM.

In some embodiments, the front and rear surfaces of each of the constituents of the display device DD are defined based on the direction in which the image IM is displayed. The front and rear surfaces may be opposite to each other in the third direction D3. A normal direction of each of the front and rear surfaces may be parallel to the third direction D3. A spaced distance between the front and rear surfaces in the third direction D3 may correspond to a thickness (or height) of the display device DD in the third direction D3.

The front surface of the display device DD may be divided into a transmission area TA and a bezel area BZA. The transmission area TA may be an area on which the image IM is displayed. A user may see the image IM through the transmission area TA. As seen in FIG. 1, the transmission area TA is illustrated as a rectangular shape having rounded vertexes, but embodiments are not limited thereto. The transmission area TA may have various shapes.

The bezel area BZA is adjacent to the transmission area TA. The bezel area BZA may have a predetermined color. The bezel area BZA may surround the transmission area TA. Thus, the shape of the transmission area TA may be substantially defined by the bezel area BZA. However, this is merely an example. For instance, the bezel area BZA may be disposed adjacent to only one side of the transmission area TA or may be omitted. The display device DD may include various embodiments, but is not limited to a specific embodiment.

The display device DD may sense a user's fingerprint FNG (or other epidermal ridge information) applied from the outside. Accordingly, the display device DD may provide a fingerprint sensing area FRA on the display surface IS. As seen in FIG. 1, the fingerprint sensing area FRA is illustrated as being provided on the transmission area TA on which the image IM is displayed. However, this is merely an example, and the fingerprint sensing area FRA may be provided on the bezel area BZA, on an entire area of the transmission area TA, and/or on an entire area of the display surface IS. The display device DD may sense the fingerprint FNG provided on the fingerprint sensing area FRA.

The fingerprint FNG of the user may include a surface state of a user's hand, for example, uniformity of the surface or a curved shape of the surface. However, this is merely an example. When an input of an inorganic body is provided to the display device DD, the display device DD may sense surface information of the inorganic body.

Referring to FIG. 2, the display device DD may include a window WM, a display module DU, an electronic module EM, a power supply module PM, a bracket BRK, and an external case EDC.

The window WM defines an outer appearance of the display device DD. The window WM may protect internal components of the display device DD from an external impact and substantially provide the display surface IS of the display device DD.

The display module DU may be disposed on a rear surface of the window WM. Description of the display module DU will be described in more detail with reference to FIG. 3.

The display module DU may be electrically connected to the electronic module EM through a flexible circuit board. The display module DU may receive information on the image IM to be displayed through the electronic module EM or provide information on a sensed fingerprint FNG to the electronic module EM to provide processed information based on the information on the fingerprint FNG to the user.

The power supply module PM may supply power for an overall operation of the display device DD. The power supply module PM may include a general battery module, but exemplary embodiments are not limited thereto.

The bracket BRK may divide an internal space of the display device DD. The bracket BRK may provide a space in which other components are capable of being disposed. The bracket BRK may include at least one of a metal and a plastic, but embodiments are not limited thereto. In FIG. 2, one bracket BRK is exemplarily illustrated, but the display device DD may include a plurality of brackets BRK.

An external case EDC may define the outer appearance of the display device DD together with the window WM. As seen in FIGS. 1 and 2, the external case EDC is provided as one body as an example, but the external case EDC may include a plurality of bodies assembled to each other. The outer case EDC may include a plurality of frames and/or plates made of, for example, glass, plastic, and/or metal.

The electronic module EM may be mounted on a motherboard and may include various functional modules for operating the display device DD. The motherboard may include a rigid type printed circuit board. The electronic module EM may include a control module, a wireless communication module, an image input module, an image output module, an audio input module, an audio output module, a memory, an external interface, a light emitting module, a light receiving module, a camera module, and/or the like. A portion of the functional modules may not be mounted on the motherboard, but may be electrically connected to the motherboard through the flexible printed circuit board.

Figure 3:
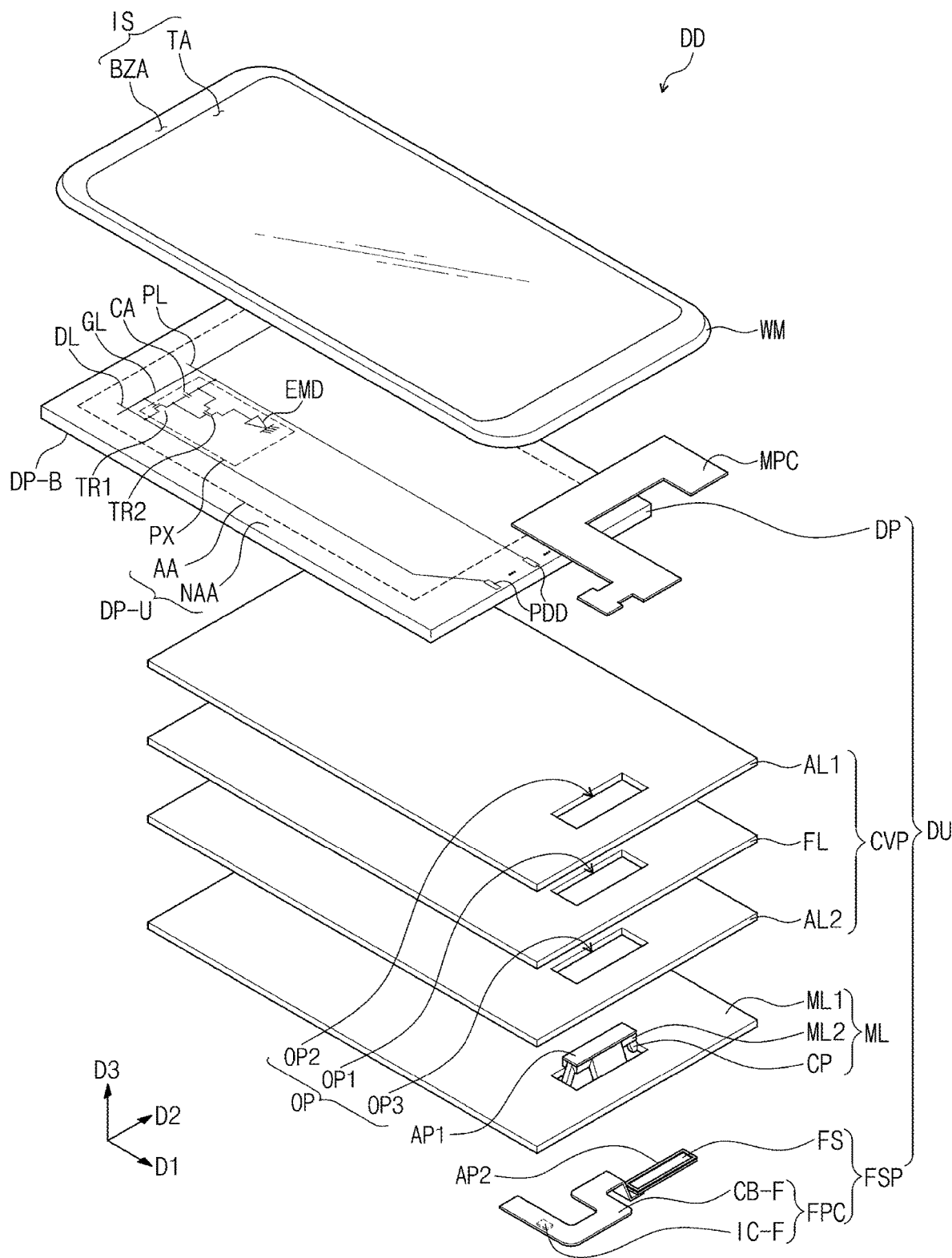
FIG. 3 is an exploded perspective view of a window and a display module among constituents illustrated in FIG. 2 according to some exemplary embodiments.
Figure 4:
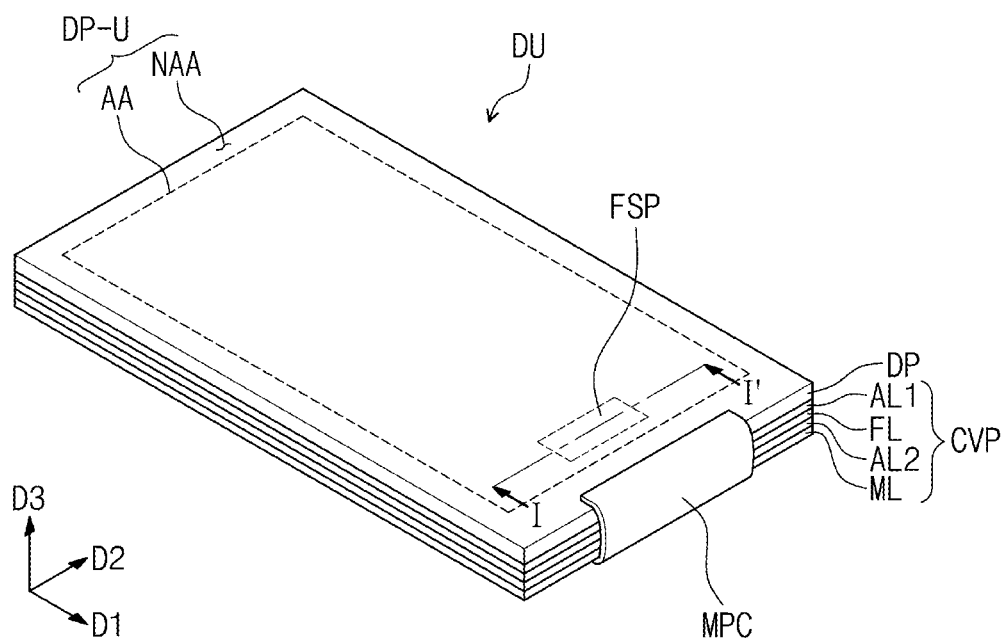
FIG. 4 is a coupled perspective view of a display module among constituents illustrated in FIG. 3 according to some exemplary embodiments.

FIG. 3 is an exploded perspective view of a window and a display module among constituents illustrated in FIG. 2 according to some exemplary embodiments. FIG. 4 is a coupled perspective view of a display module among constituents illustrated in FIG. 3 according to some exemplary embodiments.

For convenience of description, some constituents of the display panel DP are not illustrated in FIG. 4.

Referring to FIGS. 3 and 4, the display module DU may be disposed on the rear surface of the window WM. The display module DU may include a display panel DP, a main circuit board MPC, a cover panel CVP, and a fingerprint sensing part FSP.

The display panel DP may include a front surface DP-U and a rear surface DP-B opposite to the front surface DP-U. The front surface DP-U may be a surface facing the window member WM. The front surface DP-U may include an active area AA and a peripheral area NAA. As seen in FIG. 3, the rear surface DP-B of the display panel DP may be defined as a layer that is closest to the cover panel CVP among the constituents of the display panel DP, which may be laminated, formed, connected, stacked, and/or disposed on one another in the third direction D3.

The display panel DP may activate the active area AA according to an electrical signal. The display panel DP may display the image IM on the activated active area AA. The transmission area TA may entirely overlap at least with the active area AA, but embodiments are not limited thereto.

The peripheral area NAA is adjacent to the active area AA. The peripheral area NAA may surround an edge of the active area AA. However, this is merely an example, and the peripheral area NAA may be adjacent to only a portion of the edge of the active area AA and also is not limited to a specific embodiment.

Various signal lines or electronic devices for providing an electrical signal to the active area AA may be disposed on the peripheral area NAA. The peripheral area NAA may be covered by the bezel area BZA, and thus, may not be visible from the outside.

The display panel DP may include a plurality of signal lines GL, DL, and PL, a pixel PX, and a plurality of display pads PDD. The signal lines GL, DL, and PL may transmit different electrical signals to (or via) a gate line GL, a data line DL, and a power line PL, respectively.

The gate line GL may extend along the second direction D2. The gate line GL may be provided in plurality, and the plurality of gate lines GL may be arranged to be spaced apart from each other in the first direction D1. For convenience of description, a single gate line GL is exemplarily illustrated in FIG. 3.

The display module DU may further include a gate driving circuit mounted on the display panel DP to provide an electrical signal to the gate line GL. A gate driving circuit pad providing an electrical signal to the gate driving circuit may constitute one of the display pads PDD. As another example, the display panel DP may further include gate pads that are electrically connected to a gate driving circuit provided from the outside.

The data line DL may extend along the first direction D1. The data line DL may be electrically insulated from the gate line GL. The data line DL may be provided in plurality. The plurality of data lines DL may be arranged to be spaced apart from each other in the second direction D2. For convenience of description, a single data line DL is illustrated in FIG. 3. The data line DL may be connected to a data pad constituting one of the display pads PDD. The data line DL may provide a data signal received through the data pad to the pixel PX.

The power line PL may extend along the second direction D2. The power line PL may be electrically insulated from the gate line GL and the data line DL. The power line PL may be provided in plurality, and the plurality of power lines PL may be arranged to be spaced apart from each other in the first direction D1. For convenience of description, a single power line PL is illustrated in FIG. 3. The power line PL may provide a power signal to the pixel PX.

A portion of the constituents provided in the pixel PX may be disposed to overlap the active area AA. The pixels PX may be provided in plurality and connected to the corresponding signal lines, respectively. The pixels PX may be provided in plurality and connected to the corresponding signal lines, respectively. The pixel PX may display light according to an electrical signal to implement the image IM. For convenience of description, a single pixel PX is illustrated as an example in FIG. 3.

The pixel PX may include a first thin film transistor TR1, a second thin film transistor TR2, a capacitor CA, and a light emitting element EMD. The first thin film transistor TR1, the second thin film transistor TR2, the capacitor CA, and the light emitting element EMD may be electrically connected to each other.

The first thin film transistor TR1 may be a switching element that controls turn-on and turn-off of the pixel PX. The first thin film transistor TR1 may be turned on by a gate signal provided through the gate line GL to provide a data signal provided through the data line DL to the capacitor CA.

The capacitor CA may charge a voltage corresponding to a potential difference between the first power signal provided from the power line PL and a signal provided from the first thin film transistor TR1. The second thin film transistor TR2 provides the first power signal provided from the power line PL to the light emitting element EMD to correspond to the voltage charged in the capacitor CA.

The light emitting element EMD may be disposed on the active area AA. The light emitting element EMD may generate light or control an amount of light according to the electrical signal. For example, the light emitting element EMD may include an organic light emitting element, an inorganic light emitting element, a quantum dot light emitting element, and/or the like.

The light emitting element EMD may receive a second power signal having a level that is lower than that of the first power signal provided by the power line PL connected to a voltage generation unit. Driving current corresponding to a difference between the electrical signal provided from the second thin film transistor TR2 and the second power supply signal may flow through the light emitting element EMD, and the light emitting element EMD may generate light corresponding to the driving current.

A structure of the above-described pixel PX is exemplarily illustrated, but the structure of the pixel PX is not limited thereto. The pixel PX may include electronic elements having various configurations and arrangements.

The display pads PDD may be disposed on the peripheral area NAA. The display pads PDD may be connected to the signal lines GL, DL, and PL, respectively. The pixels PX may be electrically connected to constituents disposed outside the display panel DP through the display pads PDD. For example, the display pads PDD may be connected to pads provided in (or on) the main circuit board MPC.

The main circuit board MPC may include a main flexible film and a main driving element. The main circuit board MPC may be connected to the display pads PDD. The main circuit board MPC may provide an electrical signal to the display panel DP through the display pads PDD. For example, the main circuit board MPC may generate a signal or power signal for controlling the image IM to provide the signal or power signal to the display panel DP.

The main circuit board MPC may be bent toward the rear surface DP-B of the display panel DP while being connected to the front surface DP-U of the display panel DP, but exemplary embodiments are not limited thereto. The main flexible film may include a main connector, pads, and signal lines. The main flexible film may be connected to the display pads PDD through the pads and electrically connected to the display panel DP.

The main driving element may be mounted on the main flexible film. The main driving element may be connected to the signal lines of the main flexible film and electrically connected to the display panel DP. The main driving element may generate or process various electrical signals.

The cover panel CVP may be disposed below the display panel DP. The upper surface of the cover panel CVP may face the rear surface DP-B of the display panel DP. In a plan view, the cover panel CVP may have a rectangular (or generally rectangular) shape. The cover panel CVP may have a long side in the first direction D1 and a short side in the second direction D2. However, the shape of the cover panel CVP is not limited thereto. The shape of the cover panel CVP may be variously changed according to the outer appearance of the display device DD.

The cover panel CVP may include a plurality of layers. For example, the cover panel CVP may include a first adhesive layer AL1, a functional layer FL, a second adhesive layer AL2, and a metal layer ML. Each of the first adhesive layer AL1, the functional layer FL, the second adhesive layer AL2, and the metal layer ML may have a thin sheet shape, but embodiments are not limited thereto.

The first adhesive layer AL1 may face the rear surface DP-B of the display panel DP. The first adhesive layer AL1 may include an optically transparent adhesive material. For example, the first adhesive layer AL1 may include at least one of an optically transparent (or clear) resin (OCR), an optically transparent (or clear) adhesive (OCA), a double-sided tape, and a pressure-sensitive adhesive (PSA). However, the first adhesive layer AL1 is not limited thereto.

The functional layer FL may be disposed under the first adhesive layer AL1. The functional layer FL may be fixed to the display panel DP by the first adhesive layer AL1.

The functional layer FL may be a cushion layer. For example, the functional layer FL may be a synthetic resin foam including a matrix member and a plurality of pores. The matrix member may include a flexible material. For example, the matrix member may include a synthetic resin. The pores may easily absorb an impact applied to the display panel DP. The pores may be defined by a porous structure of the cushion layer. Thus, the pores may be dispersed in the matrix member. The pores may facilitate deformation of the cushion layer. Thus, elasticity of the cushion layer may be improved to improve impact resistance of the cover panel CVP. However, the functional layer FL may include other functional layers alternative of or in addition to the cushion layer.

The second adhesive layer AL2 may fix a first metal layer ML1 to the functional layer FL. The second adhesive layer AL2 may include the same material as the first adhesive layer AL1. For example, the second adhesive layer AL2 may include at least one of an optically transparent resin (OCR), an optically transparent adhesive (OCA), a double-sided tape, and a pressure-sensitive adhesive (PSA).

Openings OP may be defined in each of the first adhesive layer AL1, the functional layer FL, and the second adhesive layer AL2. For example, a first opening OP1 may be defined in the functional layer FL. The first opening OP1 may be defined in a position adjacent to a short side of the functional layer FL. In a plan view, the first opening OP1 may have a rectangular (or generally rectangular) shape, but exemplary embodiments are not limited thereto.

A second opening OP2 may be defined in the first adhesive layer AL1, and a third opening OP3 may be defined in the second adhesive layer AL2. In a plan view, each of the second opening OP2 and the third opening OP3 may have a rectangular (or generally rectangular) shape, but exemplary embodiments are not limited thereto.

Each of the second and third openings OP2 and OP3 may have the same area as the first opening OP1. Each of the second and third openings OP2 and OP3 may overlap the first opening OP1. The openings OP may be defined by the first to third openings OP1, OP2, and OP3 overlapping each other.

The metal layer ML may perform a heat dissipation function. The metal layer ML may release (or transfer) heat generated in the display panel DP to the outside. For this, the metal layer ML may include a metal material having high thermal conductivity. For example, the metal layer ML may include copper. However, the material of the metal layer ML is not limited thereto. The metal layer ML may include other metal materials alternative of or in addition to copper.

The metal layer ML may include a first metal layer ML1, connection parts CP, and a second metal layer ML2. The first metal layer ML1 may be disposed below the functional layer FL. The first metal layer ML1 may be fixed to the functional layer FL by the second adhesive layer AL2. The second metal layer ML2 may be disposed in at least some of the openings OP. A first adhesive part AP1 may be disposed on the second metal layer ML2, and the second metal layer ML2 may be attached and fixed to the rear surface DP-B of the display panel DP by the first adhesive part AP1.

The connection parts CP and the second metal layer ML2 may extend from the first metal layer ML1. A more detailed structure of the metal layer ML will be described below.

The fingerprint sensing part FSP may be disposed below the display panel DP. The fingerprint sensing part FSP may include a fingerprint sensor FS and a sensing circuit board FPC.

In a plan view, the fingerprint sensor FS may have a rectangular (or generally rectangular) shape, but exemplary embodiments are not limited thereto. The fingerprint sensor FS may have a short side in the first direction D1 and a long side in the second direction D2.

The fingerprint sensor FS may include an ultrasonic sensor. For example, the fingerprint sensor FS may sense vibration using a piezoelectric body. The fingerprint sensor FS may be disposed in at least some of the openings OP. Hereinafter, one or more of the openings OP may be collectively referred to as opening OP. A second adhesive part AP2 may be disposed on the fingerprint sensor FS, and the fingerprint sensor FS may be attached and fixed to the second metal layer ML2 by the second adhesive part AP2.

The sensing circuit board FPC may include a sensing circuit film CB-F and a sensing driving device IC-F. The sensing circuit film CB-F may be connected to the fingerprint sensor FS. For example, the sensing circuit film CB-F may be connected to the fingerprint sensor FS through an adhesive member, such as an anisotropic conductive film, or may be coupled to the fingerprint sensor FS through a separate connector. The sensing circuit film CB-F may be electrically connected to the main circuit board MPC.

The sensing driving device IC-F may be mounted on the sensing circuit film CB-F. The sensing driving device IC-F may be connected to signal lines of the sensing circuit film CB-F and electrically connected to the fingerprint sensor FS. The sensing driving device IC-F may receive the electrical signal generated by the fingerprint FNG of the user (see FIG. 1) from the fingerprint sensor FS to process the signal.

Figure 5:
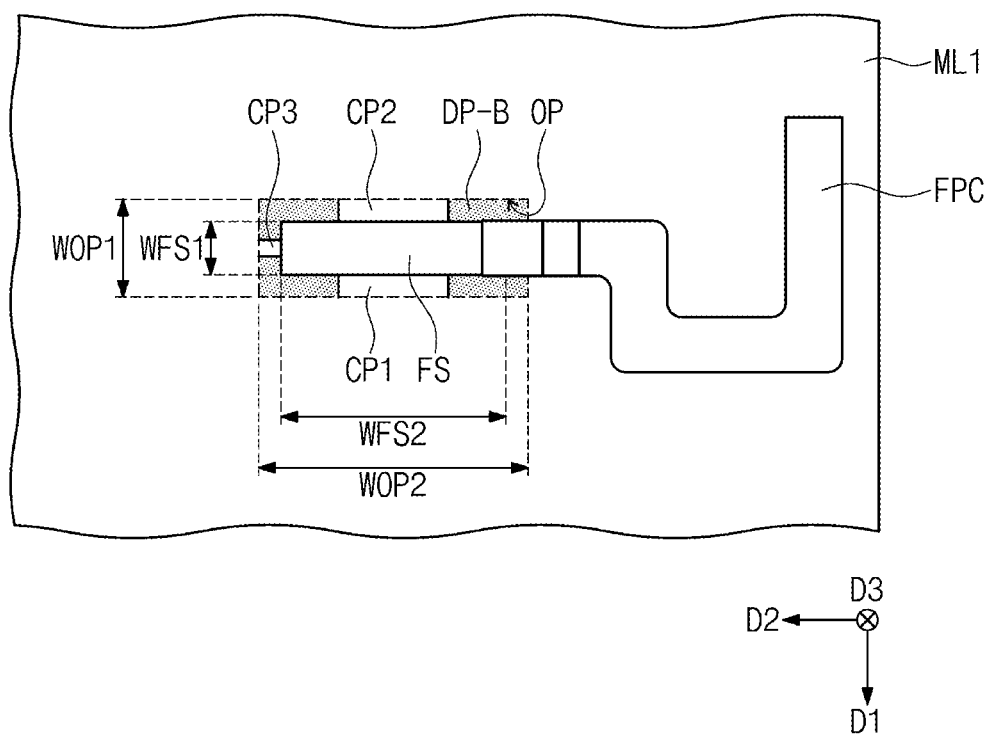
FIG. 5 is a bottom view illustrating a lower portion of a cover panel and a fingerprint sensing part of FIG. 4 according to some exemplary embodiments.
Figure 6:
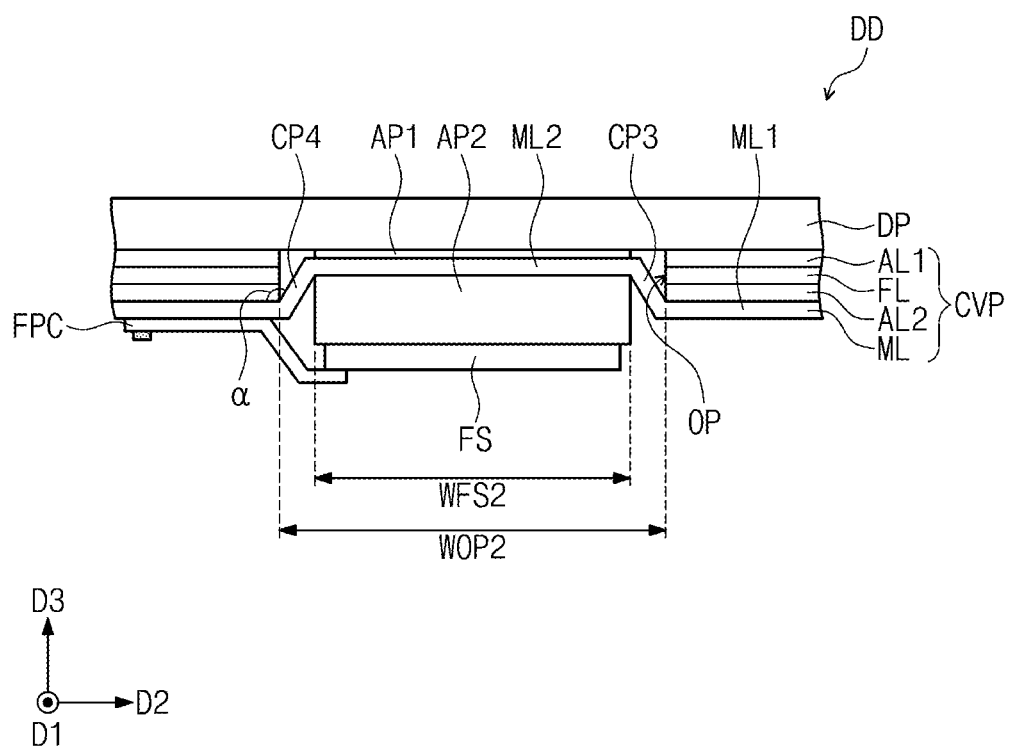
FIG. 6 is a cross-sectional view taken along sectional line I-I' of FIG. 4 according to some exemplary embodiments.

FIG. 5 is a bottom view illustrating a lower portion of a cover panel and a fingerprint sensing part of FIG. 4 according to some exemplary embodiments. FIG. 6 is a cross-sectional view taken along sectional line I-I' of FIG. 4 according to some exemplary embodiments.

Hereinafter, an arrangement structure of the cover panel CVP and the fingerprint sensing part FSP will be described in more detail with reference to FIGS. 5 and 6. Further, for convenience of description, the main circuit board MPC is omitted in FIG. 5. Also, in FIG. 5, the opening OP of the cover panel CVP is indicated by a dotted line.

Referring to FIG. 5, the fingerprint sensor FS may be disposed in the opening OP of the cover panel CVP. A width WOP1 of the opening OP in the first direction D1 may be greater than a width WFS1 of the fingerprint sensor FS in the first direction D1. A width WOP2 of the opening OP in the second direction D2 may be greater than a width WFS2 of the fingerprint sensor FS in the second direction D2. Thus, when viewed in a plan view, the fingerprint sensor FS may be smaller than the opening OP and may be spaced apart from a boundary (or border) of the opening OP and disposed in the opening OP.

The connection parts CP may be disposed between the edge of the fingerprint sensor FS and the boundary of the opening OP. The connection parts CP may extend from the first metal layer ML1. The connection parts CP may include first, second, third, and fourth connection parts CP1, CP2, CP3, and CP4.

Referring to FIG. 5, the first connection part CP1 may be disposed between a first side of the fingerprint sensor FS and the first metal layer ML1. The second connection part CP2 may be disposed between a second side opposite to the first side of the fingerprint sensor FS and the first metal layer ML1. The third connection part CP3 may be disposed between a third side of the fingerprint sensor FS and the first metal layer ML1. The fourth connection part CP4 (see FIG. 6) may be disposed between a fourth side opposite to the third side of the fingerprint sensor FS and the first metal layer ML1. In FIG. 5, the fourth connection part CP4 may not visible because of overlapping the sensing circuit board FPC when viewed in a plane.

The first side and the second side of the fingerprint sensor FS may be opposite to each other in the first direction D1. The first side and the second side may be defined as long sides of the fingerprint sensor FS extending in the second direction D2. The third side and the fourth side of the fingerprint sensor FS may be opposite to each other in the second direction D2. The third and fourth sides may be defined as short sides of the fingerprint sensor FS extending in the first direction D1.

A width of each of the first connection part CP1 and the second connection part CP2 in the second direction D2 may be smaller than a length of each of the long sides of the fingerprint sensor FS in the second direction D2, e.g., smaller than the width WFS2 of the fingerprint sensor FS in the second direction D2. A width of each of the third connection part CP3 and the fourth connection part CP4 in the first direction D1 may be smaller than a length of each of the short sides of the fingerprint sensor FS, e.g., smaller than the width WFS1 of the fingerprint sensor FS in the first direction D1. A portion of the rear surface DP-B of the display panel DP may be exposed by portions of the opening OP that do not overlap the first to fourth connection portions CP1 to CP4 and the fingerprint sensor FS.

The first to fourth connection parts CP1 to CP4 and the second metal layer ML2 may extend from the first metal layer ML1. The first to fourth connection parts CP1 to CP4, the second metal layer ML2, and the first metal layer ML1 may be integrated (or substantially integrated) with each other.

Referring to FIG. 6, the second metal layer ML2 may be disposed between the display panel DP and the fingerprint sensor FS. The second metal layer ML2 may be attached and fixed to the display panel DP by the first adhesive part AP1. The first adhesive part AP1 may include an optically transparent adhesive material. For example, the first adhesive part AP1 may include at least one of an optically transparent resin (OCR), an optically transparent adhesive (OCA), a double-sided tape, and a pressure-sensitive adhesive (PSA). However, the first adhesive part AP1 is not limited thereto. The second metal layer ML2 may be disposed closer to the display panel DP than the first metal layer ML1.

The connection parts CP may extend from the first metal layer ML1 to the second metal layer ML2. For example, as illustrated in FIG. 6, one end of each of the third and fourth connection parts CP3 and CP4 may extend from the first metal layer ML1 to the second metal layer ML2. The first metal layer ML1 may be disposed farther apart from the display panel DP in the third direction D3 than the second metal layer ML2. Accordingly, each of the third and fourth connection parts CP3 and CP4 may be inclined to have an inclined surface. The third and fourth connection parts CP3 and CP4 may form a predetermined angle $\alpha$ with respect to the first metal layer ML1, respectively. The angle $\alpha$ may be an obtuse angle.

In some embodiments, the first to second connection parts CP1 and CP2 may also be disposed in the same shape as the third and fourth connection parts CP3 and CP4. The first and second connection parts CP1 and CP2 may form an obtuse angle with respect to the first metal layer ML1, respectively.

Hereinafter, according to some exemplary embodiments, the first and second connection parts CP1 and CP2 will be described as being disposed in the same shape as the third and fourth connection parts CP3 and CP4.

According to some exemplary embodiments, the first metal layer ML1, the connection parts CP, and the second metal layer ML2 may be integrated with each other to form one metal layer. For example, before an external force is applied, the first metal layer ML1, the connection parts CP, and the second metal layer ML2 may be disposed on the same plane. The external force may mean a force acting in the third direction D3 during one or more processes of manufacturing the display device DD. The second metal layer ML2 and the connection parts CP disposed on the plane may be deformed in the third direction D2 by the external force so that the second metal layer ML2 is capable of being more adjacent to the display panel DP, and each of the connection parts CP has an inclined surface.

However, the metal layer ML does not have to be integrally formed. For example, the first metal layer ML1, the second metal layer ML2, and the connection parts CP may be separately manufactured and then connected to each other.

For example, one end of each of the first to fourth connection parts CP1 to CP4 may be connected to each of both sides of the first metal layer ML1, and the other end of each of the first to fourth connection parts CP1 to CP4 may be connected to each of both sides of the second metal layer ML2. The fingerprint sensing part FSP may be disposed below the second metal layer ML2. The second adhesive part AP2 may be disposed between the fingerprint sensing part FSP and the second metal layer ML2, and the fingerprint sensing part FSP may be fixed to the second metal layer ML2 by the second adhesive part AP2. As shown in FIG. 3, the second adhesive part AP2 may be disposed at an edge of the fingerprint sensor FS. The second adhesive part AP2 may be optically transparent. For example, the second adhesive part AP2 may include at least one of an optically transparent resin (OCR), an optically transparent adhesive (OCA), a double-sided tape, and a pressure-sensitive adhesive (PSA). However, the second adhesive part AP2 is not limited thereto.

One side of the sensing circuit board FPC may be connected to the fingerprint sensor FS. The opposite side of the sensing circuit board FPC may be connected to the first metal layer ML1. The sensing circuit board FPC may be connected to a ground terminal of the display device DD. Therefore, the metal layer ML including the first metal layer ML1 may also be grounded. As such, the metal layer ML may shield the fingerprint sensing part FSP from the display panel DP. For example, an electrical signal at a side of the display panel DP may not affect the driving of the fingerprint sensing part FSP by (or due, at least in part, to) the metal layer ML. Accordingly, the driving performance of the fingerprint sensing part FSP may be improved, and the display device DD may stably recognize the fingerprint FNG of the user.

According to some embodiments, the connection parts CP may solve an issue of the fingerprint sensing part FSP being visually recognized externally. For instance, the connection parts CP disposed between the fingerprint sensing part FSP and the cover panel CVP may reflect external light incident to the boundary of the fingerprint sensing part FSP. When the user sees the display device DD from the upper (or front) side, the rectangular shape of the fingerprint sensing part FSP may not be seen from the outside.

In some embodiments, the metal layer ML may diffuse local heat to the surroundings to discharge the local heat to the outside. For example, when heat is locally generated near the second metal layer ML2, the heat may be diffused to the first metal layer ML1 through the connection parts CP. The metal layer ML may release the heat to the outside. In this manner, operational reliability of the fingerprint sensing part FSP may be improved.

According to various exemplary embodiments, the first metal layer ML1, the second metal layer ML2, and the connection parts CP may improve the driving performance of the fingerprint sensing part FSP. Further, according to various exemplary embodiments, the first metal layer ML1, the second metal layer ML2, and the connection parts CP may limit the fingerprint sensing part FSP from being seen from the outside.

Figure 7:
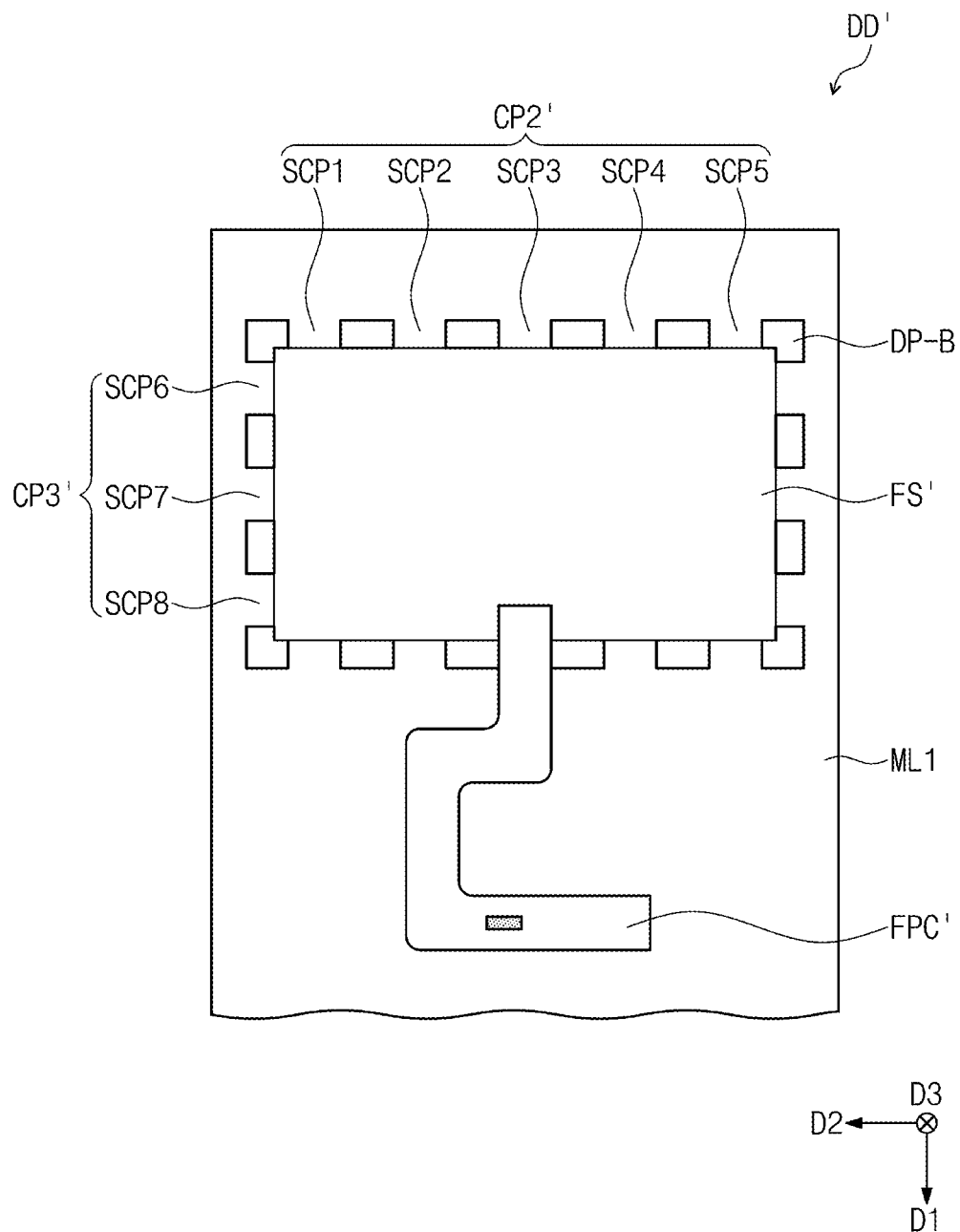
FIGS. 7 and 8A are bottom views illustrating a lower portion of a cover panel and a fingerprint sensing part of a display device according to some exemplary embodiments.

FIG. 7 is a bottom view illustrating a lower portion of a cover panel and a fingerprint sensing part of a display device according to some exemplary embodiments.

Referring to FIG. 7, a fingerprint sensing area in a display device DD' may be expanded. For example, a size of the fingerprint sensor FS' may be greater than that of the fingerprint sensor FS described in association with at least FIG. 5. In this case, each connection part may include a plurality of sub connection parts.

For example, a second connection part CP2' may include first to fifth sub connection parts SCP1 to SCP5.

The first to fifth sub connection parts SCP1 to SCP5 may be disposed between a first side of the fingerprint sensor FS' and a first metal layer ML1. The first side may be one of the long sides of the fingerprint sensor FS'. A third connection part CP3' may include sixth to eighth sub connection parts SCP6 to SCP8. The sixth to eighth sub connection parts SCP6 to SCP8 may be disposed between a third side of the fingerprint sensor FS' and the first metal layer ML1. The third side may be one of the short sides of the fingerprint sensor FS'.

A portion of a rear surface DP-B of the display panel DP may be exposed by portions of the opening that do not overlap the fingerprint sensor FS' and the sub connection parts SCP1 to SCP8.

In some embodiments, a first connection part may include five sub connection parts similar to the second connection part CP2', but may be disposed on a third side of the fingerprint sensor FS' opposing the first side of the fingerprint sensor FS'. The first connection part may be symmetrical with the second connection part CP2' based on the second direction D2.

Like the third connection part CP3', a fourth connection part may include three sub connection parts, but may be disposed on a fourth side of the fingerprint sensor FS' opposing the second side of the fingerprint sensor FS'. The fourth connection part may be symmetrical with the third connection part CP3' based on the first direction D1.

As seen in FIG. 7, a sensing circuit board FPC' may be disposed at the side of the first connection part and connected to the fingerprint sensor FS; however, the connection structure between the fingerprint sensor FS' and the sensing circuit board FPC' is not limited thereto. For example, the sensing circuit board FPC' may be disposed at the second connection part CP2' and connected to the fingerprint sensor FS'.

According to some embodiments, since each connection part may include a plurality of sub connection parts, a potential mode of failure (for example, breakage or cracking of the metal layer ML) of the metal layer ML being damaged by an external force acting during the manufacturing process may be prevented or at least reduced.

Figure 8A:
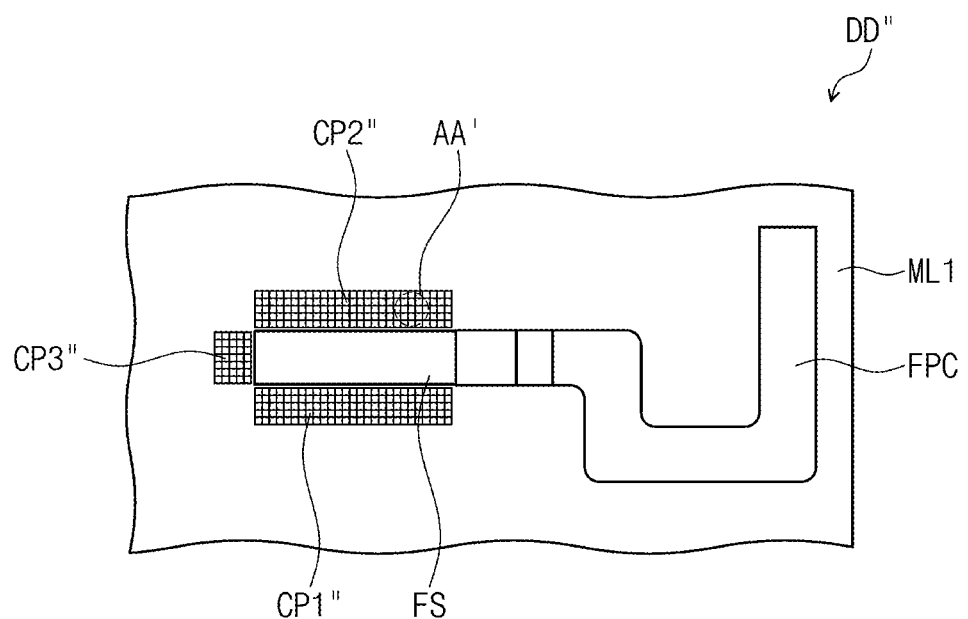
Figure 8A:
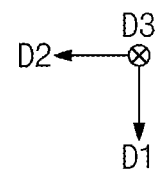
Figure 8B:
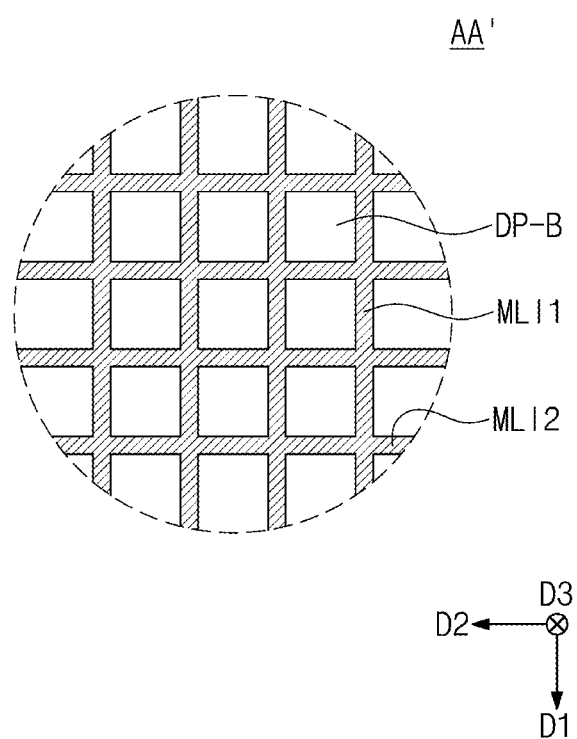
FIG. 8B is an enlarged view of portion AA' of FIG. 8A according to some exemplary embodiments.

FIG. 8A is a bottom view illustrating a lower portion of a cover panel and a fingerprint sensing part of a display device according to some exemplary embodiments. FIG. 8B is an enlarged view of portion AA' of FIG. 8A according to some exemplary embodiments.

Referring to FIGS. 8A and 8B, each connection part of a display device DD'' may include a plurality of metal lines.

For example, a second connection part CP2'' may include a plurality of first metal lines MLI1 and a plurality of second metal lines MLI2.

The first metal lines MLI1 may extend in the first direction D1. The second metal lines MLI2 may extend in the second direction D2. The first metal lines MLI1 and the second metal lines MLI2 may cross each other. In this manner, each of the connection parts, such as the first connection part CP1'', the second connection part CP2'', the third connection part CP3'', and a fourth connection part) may have a network or mesh shape.

The rear surface DP-B of the display panel DP may be exposed by the fingerprint sensor FS and portions of the openings, which do not overlap the respective connection parts (see, e.g., FIG. 8B).

A metal layer ML may be more easily deformed by external force through the connection parts having the mesh shape. Accordingly, the process of manufacturing the second metal layer ML2 may be facilitated. Also, even when some of the connection parts are partially damaged, the first metal layer ML1 and the second metal layer ML2 may be stably connected to each other.

Hereinafter, various display devices according to some exemplary embodiments will be described. In following description, a description with respect to the same configuration of an constituent element as at least one of the foregoing exemplary embodiments will be omitted, and the description will primarily focus on the difference(s).

Figure 9:
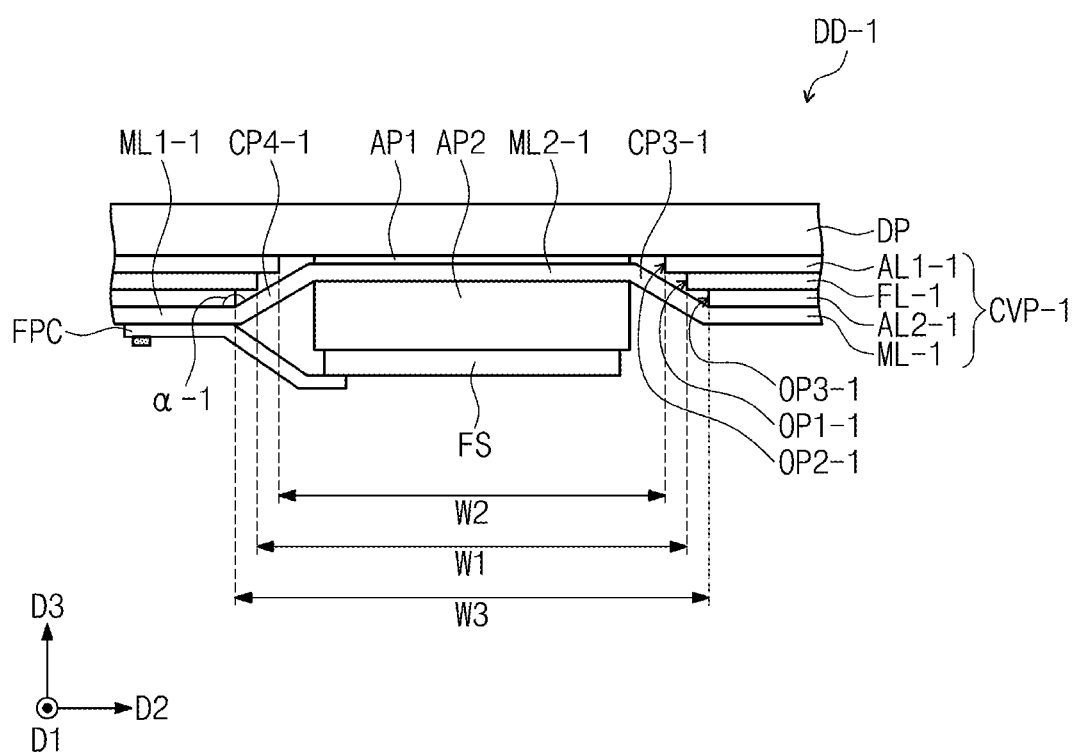
FIG. 9 is a view of a display device according to some exemplary embodiments.

FIG. 9 is a view of a display device according to some exemplary embodiments.

Referring to FIG. 9, a cover panel CVP-1 of a display device DD-1 may include a first adhesive layer AL1-1, a functional layer FL-1, a second adhesive layer AL2-1, and a metal layer ML-1.

In some embodiments, inner boundaries of the first adhesive layer AL1-1, the functional layer FL-1, and the second adhesive layer AL2-1 may have a stair shape.

A first opening OP1-1 may be defined in the functional layer FL-1. A second opening OP2-1 may be defined in the first adhesive layer AL1-1, and a third opening OP3-1 may be defined in the second adhesive layer AL2-1.

A width W1 of the first opening OP1-1 in the second direction D2 may be greater than a width W2 of the second opening OP2-1 in the second direction D2. A width W1 of the first opening OP1-1 in the second direction D2 may be less than a width W3 of the third opening OP3-1 in the second direction D2. Accordingly, the first adhesive layer AL1-1, the functional layer FL-1, and the second adhesive layer AL2-1 may be arranged in a stair shape.

When viewed in a plan view, the first metal layer ML1-1 may have the same area as the second adhesive layer AL2-1. One end of each of third and fourth connection parts CP3-1 and CP4-1 may extend from the first metal layer ML1-1 to the second metal layer ML2-1.

Inner corners of the first adhesive layer AL-1, the functional layer FL-1, and the second adhesive layer AL2-1, which are adjacent to the third and fourth connection parts CP3-1 and CP4-1, may contact the third and fourth connection parts CP3-1 and CP4-1. An impact acting on the third and fourth connection parts CP3-1 and CP4-1 may be dispersed to the first adhesive layer AL-1, the functional layer FL-1, and the second adhesive layer AL2-1 by the contacting corners.

The first and second connection parts may also be disposed in the same shape as the third and fourth connection parts CP3-1 and CP4-1.

According some embodiments, since the first adhesive layer AL1-1, the functional layer FL-1, and the second adhesive layer AL2-1 are arranged in the stair shape, the inclination of each of the connection parts (e.g., the third and fourth connection parts CP3-1 and CP4-1) may be relatively gentle when compared to the foregoing exemplary embodiments. The connection parts may form a predetermined angle α-1 with the first metal layer ML1-1. The angle α-1 may be greater than the angle α.

As the inclination of each of the connection parts is more gentle, the formation of the metal layer ML-1 may be facilitated in the manufacturing process, and potential damage to the metal layer ML-1 by external force may be prevented or at least further reduced. Also, the impact applied to the connection parts may be dispersed to the peripheral constituents by the first adhesive layer AL-1, the functional layer FL-1, and the second adhesive layer AL2-1. Thus, it may be possible to prevent the connection parts from being damaged.

Figure 10:
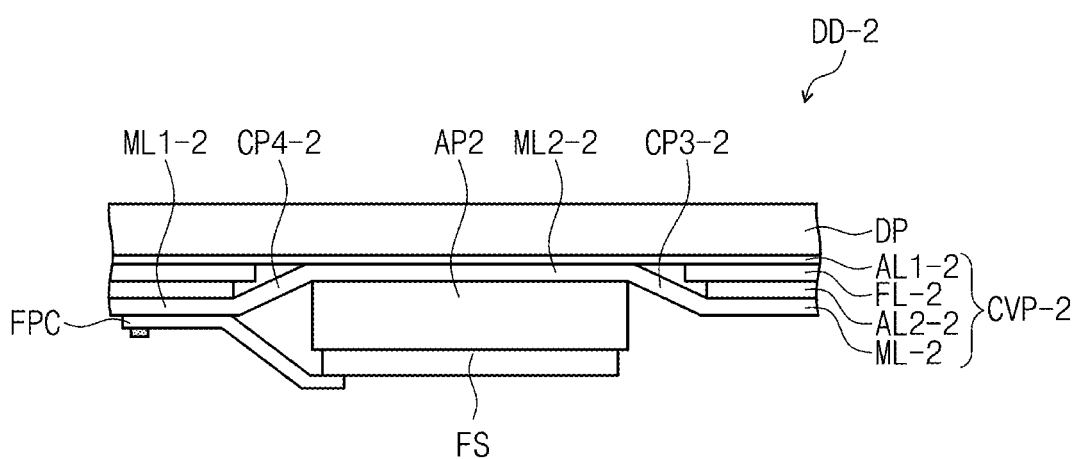
FIG. 10 is a view of a display device according to some exemplary embodiments.
Figure 10:
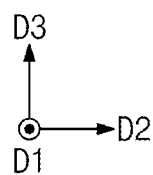

FIG. 10 is a view of a display device according to some exemplary embodiments.

Referring to FIG. 10, a cover panel CVP-2 of a display device DD-2 may include a first adhesive layer AL1-2, a functional layer FL-2, a second adhesive layer AL2-2, and a metal layer ML-2.

In some embodiments, the first adhesive layer AL1-2 may extend between the second metal layer ML2-2 and a display panel DP. For example, the first adhesive layer AL1-2 may be disposed on an entire rear surface DP-B of the display panel DP. The functional layer FL-2 and the second metal layer ML2-2 of the cover panel CVP-2 may be attached and fixed to the display panel DP by the first adhesive layer AL1-2.

The first adhesive layer AL1-2 may have a thinner thickness than that of each of the first and second adhesive layers according to the foregoing exemplary embodiments. As such, an inclination of each of the third and fourth connection parts CP3-2 and CP4-2 may be more gentle. Similarly, the inclination of each of the first and second connection parts may be more gentle.

According to some exemplary embodiments, since the first adhesive layer AL1-2 extends between the second metal layer ML2-2 and the display panel DP, a process of manufacturing the display device DD-2 may be further simplified. Also, since the first adhesive layer AL1-2 has a thinner thickness, a fingerprint sensor FS may operate more stably.

Figure 11:
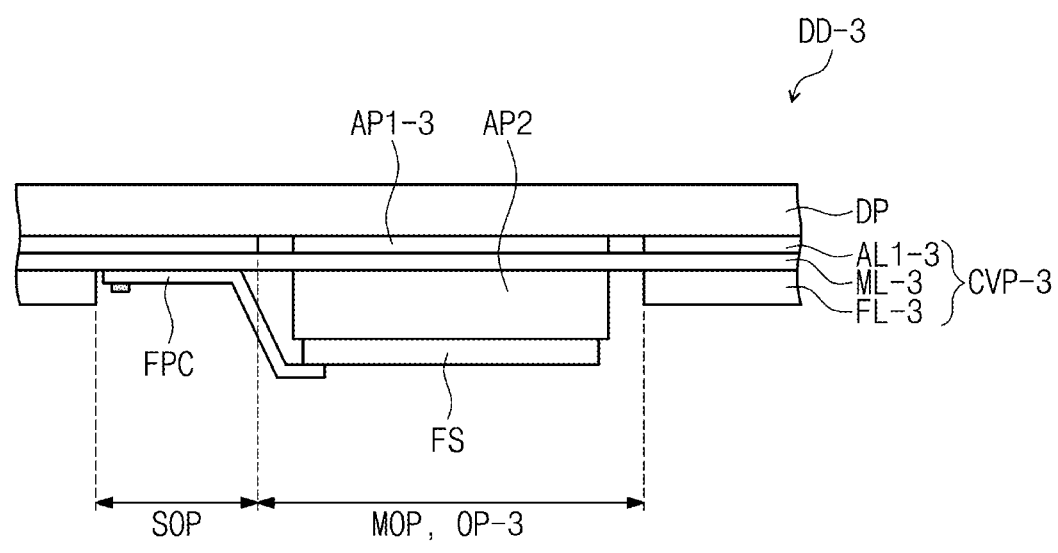
FIG. 11 is a view of a display device according to some exemplary embodiments.
Figure 11:
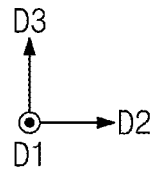

FIG. 11 is a view of a display device according to some exemplary embodiments.

Referring to FIG. 11, a cover panel CVP-3 of a display device DD-3 may include a first adhesive layer AL1-3, a metal layer ML-3, and a functional layer FL-3.

The metal layer ML-3 may be disposed below a display panel DP. The metal layer ML-3 may be disposed on an entire lower portion of the display panel DP. For example, the metal layer ML-3 may be disposed on an upper portion of the cover panel CVP-3. The metal layer ML-3 may extend in parallel to the first direction D1 and the second direction D2 between the display panel DP and the fingerprint sensor FS. Therefore, the metal layer ML-3 according some embodiments may not require external force for deforming a shape thereof.

The first adhesive layer AL1-3 and the first adhesive part AP1-3 may be disposed between the display panel DP and the metal layer ML-3. The metal layer ML-3 may be attached and fixed to the display panel DP by the first adhesive layer AL1-3 and the first adhesive part AP1-3.

An opening OP-3 may be defined in the first adhesive layer AL1-3. The first adhesive part AP1-3 may be disposed in the opening OP-3. The first adhesive layer AL1-3 and the first adhesive part AP1-3 may have different thicknesses. However, the first adhesive layer AL1-3 and the first adhesive part AP1-3 need not be provided separately. The first adhesive layer AL1-3 and the first adhesive part AP1-3 may be implemented as one layer. However, when the thicknesses of the first adhesive layer AL1-3 and the first adhesive part AP1-3 are different from each other, heights of a center portion and a boundary portion of the metal layer ML-3 in the third direction D3 may be different from each other.

The functional layer FL-3 may be disposed below the metal layer ML-3. The functional layer FL-3 may be attached and fixed to the metal layer ML-3 by a second adhesive layer.

A main opening MOP and a sub opening SOP may be defined in the functional layer FL-3. The main opening MOP may overlap an opening OP-3 of the first adhesive layer AL1-3. The sub opening SOP may be defined adjacent to the main opening MOP. The main opening MOP and the sub opening SOP may be portions of one opening.

A fingerprint sensor FS may be attached and fixed to the metal layer ML-3 by the second adhesive part AP2.

A sensing circuit board FPC may be connected to the fingerprint sensor FS. The sensing circuit board FPC may be connected to the metal layer ML-3 exposed through the sub opening SOP. The sensing circuit board FPC may be connected to a ground terminal of the display device DD-3. Therefore, the metal layer ML-3 may also be grounded.

According some embodiments, the metal layer ML-3 may be disposed above the cover panel CVP-3. Accordingly, the metal layer ML-3 may have the same height in the third direction D3. As a result, the process for deforming the shape of the metal layer ML-3 may be omitted, and the process of manufacturing the display device DD-3 may be simplified.

According to various exemplary embodiments, a second metal layer may be disposed between a display panel and a fingerprint sensing part to shield the fingerprint sensing part from the display panel, e.g., electrical signals of the display panel. Accordingly, the electrical signal of the display panel-side may not affect the driving of the fingerprint sensing part to improve the driving performance of the fingerprint sensing part.

According various exemplary embodiments, a second metal layer may be disposed between a display panel and a fingerprint sensing part, and a connection part may be disposed at a boundary of the fingerprint sensing part. Accordingly, external visibility of the fingerprint sensing part may be prevented or at least reduced.

Although certain exemplary embodiments and implementations have been described herein, other embodiments and modifications will be apparent from this description. Accordingly, the inventive concepts are not limited to such embodiments, but rather to the broader scope of the accompanying claims and various obvious modifications and equivalent arrangements as would be apparent to one of ordinary skill in the art.

What is claimed is:

1. A display device comprising:
a display panel;
a fingerprint sensing part covered by the display panel; and
a cover panel covered by the display panel and comprising a metal layer,
wherein the metal layer comprises:
a first metal layer surrounding the fingerprint sensing part in a plan view; and
a second metal layer electrically connected to and extending from the first metal layer and disposed between the display panel and the fingerprint sensing part.

2. The display device of claim 1, wherein the cover panel further comprises a functional layer disposed between the display panel and the first metal layer.

3. The display device of claim 2, wherein the fingerprint sensing part is disposed in a first opening in the functional layer.

4. The display device of claim 3, wherein:
the first opening has a rectangular shape; and
the second metal layer extends from a portion of the first metal layer, the portion being adjacent to each side of the rectangular shape.

5. The display device of claim 1, further comprising:
a connection part disposed between the first metal layer and the second metal layer,
wherein the connection part extends from the first metal layer to the second metal layer.

6. The display device of claim 5, wherein the connection part comprises a plurality of sub connection parts extending from the first metal layer to the second metal layer.

7. The display device of claim 6, wherein:
the connection part comprises:
a plurality of first metal lines extending in a first direction; and
a plurality of second metal lines extending in a second direction; and
the plurality of first metal lines and the plurality of second metal lines cross each other.

8. The display device of claim 5, wherein the second metal layer is more adjacent to the display panel than the first metal layer.

9. The display device of claim 8, wherein the connection part has an inclined surface forming an obtuse angle with respect to the first metal layer.

10. The display device of claim 3, wherein the cover panel further comprises:
a first adhesive layer disposed between the functional layer and the display panel; and
a second adhesive layer disposed between the first metal layer and the functional layer.

11. The display device of claim 10, wherein the first adhesive layer extends between the second metal layer and the display panel.

12. The display device of claim 10, wherein:
the fingerprint sensing part is disposed in the first opening;
a second opening is defined in the first adhesive layer; and
a third opening is defined in the second adhesive layer.

13. The display device of claim 12, wherein inner boundaries of the functional layer, the first adhesive layer, and the second adhesive layer that respectively define the first, second, and third openings have a stair shape.

14. The display device of claim 13, wherein, in the plan view:
the first opening is larger than the second opening; and
the third opening is larger than the first opening.

15. The display device of claim 2, wherein the functional layer comprises a cushion layer configured to absorb an impact applied to the display panel.

16. The display device of claim 1, wherein the fingerprint sensing part comprises an ultrasonic sensor.

17. The display device of claim 16, wherein the fingerprint sensing part further comprises a sensing circuit board connected to the ultrasonic sensor.

18. The display device of claim 17, wherein:
the sensing circuit board is grounded; and
the first metal layer is connected to the sensing circuit board and is grounded.

19. A display device comprising:
a display panel;
a cover panel covered by the display panel and comprising a metal layer; and
a fingerprint sensing part covered by the metal layer,
wherein the fingerprint sensing part comprises:
a fingerprint sensor; and
a sensing circuit board connected to the fingerprint sensor, and
wherein:

the cover panel further comprises a functional layer covered by the metal layer;

the fingerprint sensor is disposed in a first opening in the functional layer; and the sensing circuit board is disposed in a second opening in the functional layer.

20. The display device of claim 19, wherein the metal layer is disposed on an entire lower portion of the display panel.

\* \* \* \* \*